United States Patent
Qiao

(10) Patent No.: US 12,005,807 B2
(45) Date of Patent: Jun. 11, 2024

(54) METHOD FOR CONTROL POWER OF BATTERY, CONTROL APPARATUS, AND ELECTRIC VEHICLE

(71) Applicant: CALB Co., Ltd., Jiangsu (CN)

(72) Inventor: Peipei Qiao, Luoyang (CN)

(73) Assignee: CALB Co., Ltd., Jiangsu (CN)

( * ) Notice: Subject to any disclaimer, the term of this patent is extended or adjusted under 35 U.S.C. 154(b) by 477 days.

(21) Appl. No.: 17/013,630

(22) Filed: Sep. 6, 2020

(65) Prior Publication Data

US 2021/0197690 A1  Jul. 1, 2021

(30) Foreign Application Priority Data

Dec. 31, 2019 (CN) .......................... 201911419478.7

(51) Int. Cl.
  B60L 58/13 (2019.01)
  G01R 31/382 (2019.01)
  H01M 10/42 (2006.01)

(52) U.S. Cl.
  CPC ............ B60L 58/13 (2019.02); G01R 31/382 (2019.01); H01M 10/4257 (2013.01); B60L 2240/547 (2013.01); H01M 2010/4271 (2013.01)

(58) Field of Classification Search
  CPC .... B60L 58/13; B60L 2240/547; B60L 58/14; B60L 2240/54; G01R 31/382; H01M 10/4257; H01M 2010/4271; H02J 7/00712; H02J 7/0048

See application file for complete search history.

(56) References Cited

U.S. PATENT DOCUMENTS

2020/0313255 A1* 10/2020 Wu ........................ B60H 1/323

FOREIGN PATENT DOCUMENTS

| CN | 108162968 | 6/2018 |
| CN | 108227817 | 6/2018 |
| CN | 109284563 | 1/2019 |
| CN | 109532515 | 3/2019 |
| CN | 110031767 | 7/2019 |

OTHER PUBLICATIONS

"Office Action of China Counterpart Application", issued on Dec. 1, 2020, with partial English translation thereof, p1-p9.
"Office Action of Europe Counterpart Application", issued on Sep. 7, 2022, pp. 1-5.
1 "Search Report of Europe Counterpart Application", issued on Mar. 1, 2021, p1-p9.
"Office Action of China Counterpart Application" with English translation thereof, issued on Apr. 2, 2021, p1-p8.
"Office Action of Europe Counterpart Application", issued on Feb. 28, 2024, p1-p4.

* cited by examiner

Primary Examiner — Stewart A Fraser
(74) Attorney, Agent, or Firm — JCIP GLOBAL INC.

(57) ABSTRACT

The disclosure provides a method for control a power of a battery, a control apparatus, and an electric vehicle. By adjusting the actual power according to a difference between the rated powers and the current actual power, the power output by the battery and the power fed back to the battery can be controlled.

14 Claims, 10 Drawing Sheets

METHOD FOR CONTROL POWER OF BATTERY, CONTROL APPARATUS, AND ELECTRIC VEHICLE

CROSS-REFERENCE TO RELATED APPLICATION

This application claims the priority benefit of China application serial no. 201911419478.7, filed on Dec. 31, 2019. The entirety of the above-mentioned patent application is hereby incorporated by reference herein and made a part of this specification.

BACKGROUND

Technical Field

The disclosure relates to a battery, and particularly relates to a method for controlling a power of a battery, a control apparatus, and an electric vehicle.

Description of Related Art

In the actual operating mode, the need of a vehicle for power changes dynamically. For example, the needs for power are different when the vehicle is under the operating modes of starting, accelerating, climbing uphill, etc. If the vehicle is an electric vehicle, the power output by and fed back to the battery also change dynamically. In other words, as the cycle times increase, the internal resistance and the capacity of the battery may change, which, as a consequence, change the lifetime of the battery as well as the maximum power output by the battery.

Therefore, how to effectively utilize the energy of the battery and prevent the battery from being excessively used while ensuring the energy released by the battery satisfies the need of the vehicle for power remains an issue for researchers of relevant fields to work on.

SUMMARY

Embodiments of the disclosure provide a method for controlling a power of a battery, a control apparatus, and an electric vehicle capable of effectively utilizing the energy of the battery.

In a first aspect, an embodiment of the disclosure provides a method for controlling a power of a battery. The method includes: obtaining rated powers of the battery and a current actual power of the battery; and adjusting the actual power according to a difference between the rated powers and the current actual power when the current actual power is greater than or equal to the rated powers.

In a second aspect, an embodiment of the disclosure provides a control apparatus for a power of a battery. The control apparatus includes an obtainer and an adjuster. The obtainer is configured for obtaining rated powers of the battery and a current actual power of the battery. The adjuster is configured for adjusting the actual power according to a difference between the rated powers and the current actual power when the current actual power is greater than or equal to the rated powers.

In a third aspect, an embodiment of the disclosure provides an electric vehicle including a battery and a controller. The controller includes the control apparatus according to the embodiments of the disclosure, or the controller controls a power of the battery according to the method according to the embodiments of the disclosure.

With the method for controlling the power of the battery, the control apparatus for the power of the battery, and the electric vehicle according to the embodiments of the disclosure, by adjusting the actual power according to a difference between the rated powers and the current actual power, the power output by the battery and the power fed back to the battery can be optimized.

BRIEF DESCRIPTION OF THE DRAWINGS

For a better understanding of the disclosure, reference may be made to exemplary embodiments shown in the following drawings. The components in the drawings are not necessarily to scale and related elements may be omitted, or in some instances proportions may have been exaggerated, so as to emphasize and clearly illustrate the features described herein. In addition, related elements or components can be variously arranged, as known in the art. Further, in the drawings, like reference numerals designate same or like parts throughout the several views.

DESCRIPTION OF THE EMBODIMENTS

Figure 1:
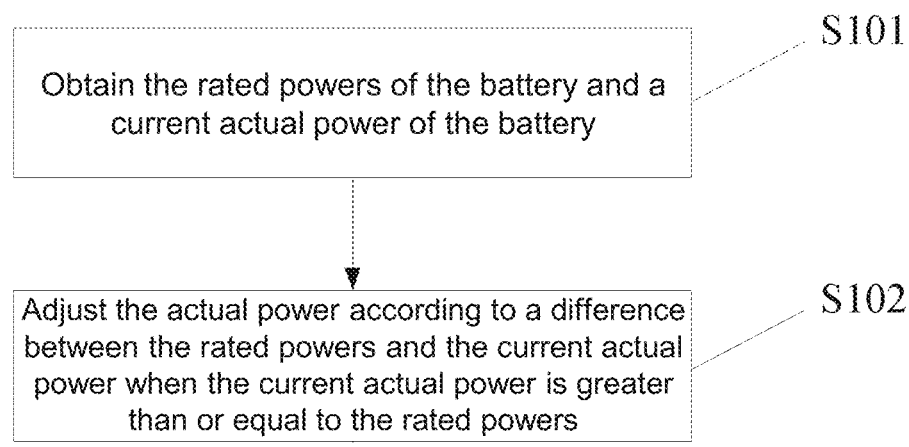
FIG. 1 is a flowchart illustrating a method for controlling a power of a battery according to an embodiment of the disclosure.

The technical solutions in the exemplary embodiments of the disclosure will be described clearly and explicitly in conjunction with the drawings in the exemplary embodiments of the disclosure. The description proposed herein is just the exemplary embodiments for the purpose of illustrations only, not intended to limit the scope of the disclosure, so it should be understood that and various modifications and variations could be made thereto without departing from the scope of the disclosure.

In the description of the present disclosure, unless otherwise specifically defined and limited, the terms "first", "second" and the like are only used for illustrative purposes and are not to be construed as expressing or implying a relative importance. The term "plurality" is two or more. The term "and/or" includes any and all combinations of one or more of the associated listed items.

Reference will now be made in detail to the present preferred embodiments of the disclosure, examples of which are illustrated in the accompanying drawings. Wherever possible, the same reference numbers are used in the drawings and the description to refer to the same or like parts.

In the following, descriptions will be made in detail about the examples of a method for controlling a power of a battery, a control apparatus, and an electric vehicle according to the embodiments of the disclosure with reference to the accompanying drawings. It should be noted that the embodiments described herein are merely some, instead of all, of the embodiments of the disclosure. Other embodiments attained by people skilled in the art based on the embodiments of the disclosure without creative labor shall still fall within the scope of the disclosure.

An embodiment of the disclosure provides a method for controlling a power of a battery. As shown in FIG. 1, the method includes the following.

Step S101: Obtain the rated powers of the battery and a current actual power of the battery.

The rated powers and/or the peak powers of the battery are construed as prescribed power parameters. When obtaining the prescribed power parameters of the battery, a battery management system may periodically transmit the prescribed power parameters to a control apparatus, such as, but not limited to, transmitting the prescribed power parameters every 0.1 s, so that the control apparatus obtains the prescribed power parameters.

The prescribed power parameters may be construed as the power parameters predetermined in the battery, such as a predetermined discharge rated power and a predetermined charge rated power.

The current power of the battery may be obtained periodically or obtained at any time. That is, the time when the current power of the battery is obtained may be set based on practical needs. In addition, any process well-known by people skilled in the art for obtaining the current power of the battery may be adopted when obtaining the current power of the battery. The disclosure is not particularly limited in this regard.

Step S102: Adjust the actual power according to a difference between the rated powers and the current actual power when the current actual power is greater than or equal to the rated powers.

In the embodiment of the disclosure, by adjusting the actual power according to a difference between the rated powers and the current actual power, the power output by the battery and the power fed back to the battery can be optimized. Accordingly, the energy of the battery can be utilized effectively to avoid excessive use of the battery while ensuring that the energy released by the battery satisfies the need of the electric vehicle for power. Therefore, the embodiment of the disclosure exhibits crucial effects in facilitating the performance of the electric vehicle, avoiding an operation failure of the battery, elongating the lifetime of the battery, etc.

Optionally, the prescribed power parameters further includes peak powers.

A maximum power output by the battery is controlled to be not greater than the rated powers after a power output by the battery is controlled to drop the power to the rated powers when the current actual power is greater than the peak powers.

Optionally, a maximum power output by the battery is controlled to be not greater than peak powers when the current actual power is less than the rated powers.

Optionally, adjusting the actual power according to the comparison power includes: controlling a maximum power output by the battery to be not greater than the peak powers, or to drop the power to the rated powers according to the comparison power.

Figure 12:
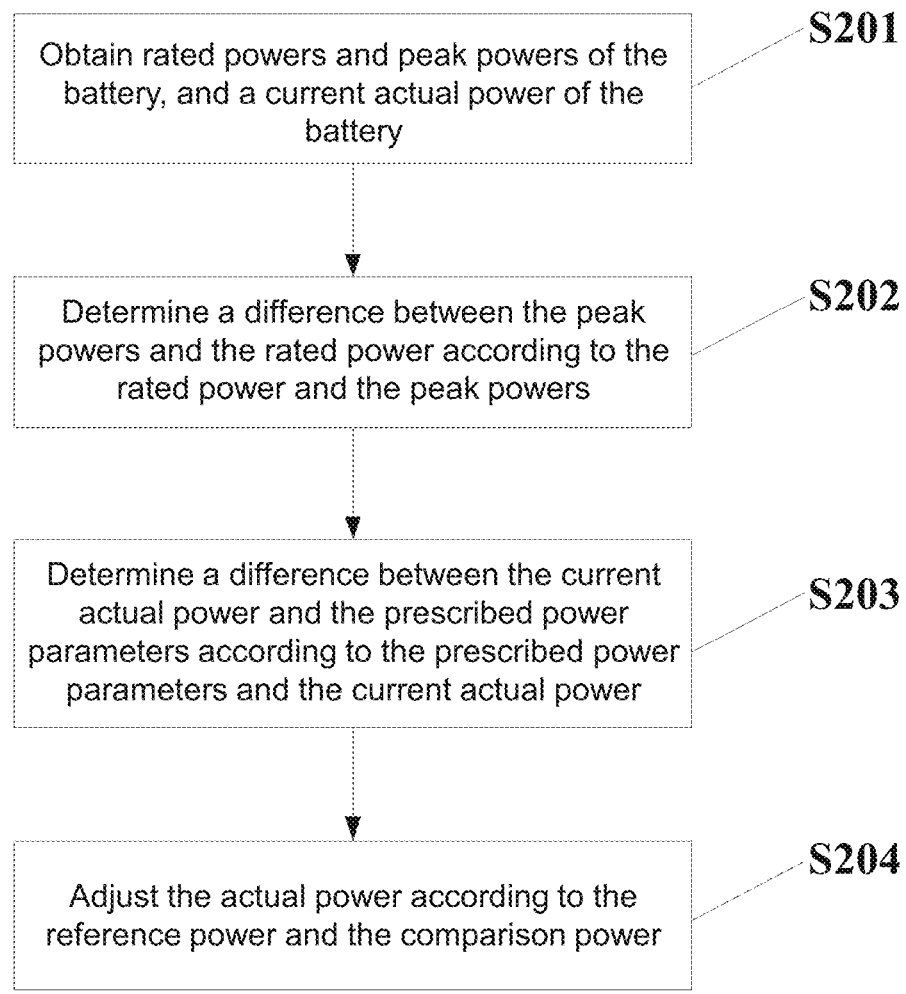
FIG. 12 is another flowchart illustrating a method for controlling a power of a battery according to an embodiment of the disclosure.

Optionally, an embodiment of the disclosure provides a method for controlling a power of a battery. As shown in FIG. 12, the method includes the following.

Step S201: Obtain rated powers and peak powers of the battery, and a current actual power of the battery.

The rated powers and/or the peak powers of the battery are construed as prescribed power parameters. The prescribed power parameters may include a discharge rated power and a charge rated power.

When obtaining the prescribed power parameters of the battery, a battery management system may periodically transmit the prescribed power parameters to a control apparatus, such as, but not limited to, transmitting the prescribed power parameters every 0.1 s, so that the control apparatus obtains the prescribed power parameters.

The prescribed power parameters may be construed as the power parameters predetermined in the battery, such as a predetermined discharge rated power and a predetermined charge rated power.

The current power of the battery may be obtained periodically or obtained at any time. That is, the time when the current power of the battery is obtained may be set based on practical needs. In addition, any process well-known by people skilled in the art for obtaining the current power of the battery may be adopted when obtaining the current power of the battery. The disclosure is not particularly limited in this regard.

Step S202: Determine a difference between the peak powers and the rated power according to the rated power and the peak powers.

The reference power may include a discharge reference power or a charge reference power.

Step S203: Determine a difference between the current actual power and the prescribed power parameters according to the prescribed power parameters and the current actual power.

The comparison power may include a discharge comparison power and/or a charge comparison power. A difference between the peak powers and the rated powers is construed as a comparison power. A difference between the current actual power and the prescribed power parameters is construed as a reference power.

Step S204: Adjust the actual power according to the reference power and the comparison power.

In the embodiment of the disclosure, by adjusting the actual power according to the reference power and the comparison power, the power output by the battery and the power fed back to the battery can be optimized. Accordingly, the energy of the battery can be utilized effectively to avoid excessive use of the battery while ensuring that the energy released by the battery satisfies the need of the electric vehicle for power. Therefore, the embodiment of the disclosure exhibits crucial effects in facilitating the performance of the electric vehicle, avoiding an operation failure of the battery, elongating the lifetime of the battery, etc.

In practice, when the prescribed power parameters include a discharge peak power or a charge peak power, and the prescribed power parameters further include the discharge rated power or the charge rated power, the methods as follows may be adopted to determine the reference power and the comparison power.

Method 1: Optionally, in the embodiment of the disclosure, a difference between the peak powers and the rated powers is determined according to the rated powers and the peak powers. Specifically, determining a difference between the peak powers and the rated powers according to the rated powers and the peak powers includes: calculating the discharge reference power according to a difference between the discharge peak power and the discharge rated power; and calculating the charge reference power according to a difference between the charge peak power and the charge rated power.

For example, the discharge reference power and the charge reference power may be calculated according to formulae as follows:

$$S_{1\_d}=[P_{d\_m}(SOC,T,t1)-P_{d\_r}(SOC,T,t1)]\times t1;$$

$$S_{1\_c}=[P_{c\_m}(SOC,T,t2)-P_{c\_r}(SOC,T,t2)]\times t2;$$

wherein T represents a temperature, SOC represents a state of charge, t1 represents a time of applying a discharge power to the battery, t2 represents a time of applying a charge power to the battery, $S_{1\_d}$ represents the discharge reference power, $S_{1\_c}$ represents the charge reference power, $P_{d\_m}(SOC, T, t1)$ represents the discharge peak power when the temperature is T, the state of charge of the battery is SOC, and the time of applying the discharge power is t1, $P_{d\_r}(SOC, T, t1)$ represents the discharge rated power when the temperature is T, the state of charge of the battery is SOC, and the time of applying the discharge power is t1, $P_{c\_m}(SOC, T, t2)$ represents the charge peak power when the temperature is T, the state of charge of the battery is SOC, and the time of applying the charge power is t2, and $P_{c\_r}(SOC, T, t2)$ represents the charge rated power when the temperature is T, the state of charge of the battery is SOC, and the time of applying the charge power is t2.

It should be noted that the above formulae merely serve as an example to describe the process of calculating the reference power. However, in practical situations, the process of calculating the reference power is not limited thereto, any process should fall within the scope of the embodiments of the disclosure as long as such process can calculate the discharge reference power according to the difference between the discharge peak power and the discharge rated power and calculate the charge reference power according to the difference between the charge peak power and the charge rated power.

t1 may be set as 30 s, but is not limited to 30 s, whereas t2 may be set as 10 s, but is not limited to 10 s. In other words, the values of t1 and t2 may be set according to practical situations to satisfy the needs under various scenarios and provide flexibility in design.

Accordingly, the reference power can be determined through a simple method, and the actual power can be adjusted by using the reference power. As a result, the control over the power of the battery can be realized.

Correspondingly and optionally, in the embodiment of the disclosure, determining a difference between the current actual power and the prescribed power parameters according to the prescribed power parameters and the current actual power includes: performing an integral process on a difference between the current actual power and the discharge rated power to obtain the discharge comparison power; performing an integral process on a difference between the current actual power and the charge rated power to obtain the charge comparison power.

For example, the discharge comparison power and the charge comparison power may be calculated according to formulae as follows:

$$S2\_d=\int_a^b(P1-Pd\_r(SOC,T,t1))\times dt;$$

$$S2\_c=\int_a^b(P1-Pc\_r(SOC,T,t2))\times dt;$$

wherein T represents the temperature, SOC represents the state of charge, t1 represents the time of applying the discharge power to the battery, t2 represents the time of applying the charge power to the battery, S2_d represents the discharge comparison power, S2_c represents the charge comparison power, Pd_r(SOC, T, t1) represents the discharge rated power when the temperature is T, the state of charge of the battery is SOC, and the time of applying the discharge power is t1, Pc_r(SOC, T, t2) represents the charge rated power when the temperature is T, the state of charge of the battery is SOC, and the time of applying the charge power is t2, a and b are time parameters, and P1 represents the actual power output by the battery.

Accordingly, the comparison power can be determined through a simple method, and the actual power can be adjusted by using the comparison power. As a result, the control over the power of the battery can be realized.

Method 2: Optionally, in the embodiment of the disclosure, a difference between the peak powers and the rated power is determined according to the rated power and the peak powers. Specifically, determining a difference between the peak powers and the rated power according to the rated power and the peak power includes: performing an integral process on the discharge peak power to calculate the discharge reference power; or performing an integral process on the charge peak power to determine the charge reference power.

When performing the integral process, the integral process mentioned in Method 1 may be adopted. As details in this regard have been described above, the same details will not be repeated in the following.

Correspondingly, in the embodiment of the disclosure, determine a difference between the current actual power and the prescribed power parameters according to the prescribed power parameters and the current actual power specifically includes: performing an integral process on the current actual power to obtain the discharge comparison power; or performing an integral process on the current actual power to obtain the charge comparison power.

Similarly, when performing the integral process, the integral process mentioned in Method 1 may be adopted. As details in this regard have been described above, the same details will not be repeated in the following.

In practical situations, in addition Method 1 and Method 2 above, other methods may also be adopted to determine the reference power and the comparison power, such as, but not limited to, performing an integral process on the difference between the current actual power and the peak power (including the discharge peak power or the charge peak power) to obtain the comparison power or performing an integral process on a ratio between the current actual power and the peak power to obtain the comparison power; or performing an integral process on a ratio between the current actual power and the rated power (including the discharge rated power or the charge rated power) to obtain the comparison power, etc. The reference power and the comparison power may also be obtained by performing an averaging process or other processes, such as, but not limited to, performing an averaging process on the difference between the current actual power and the peak power (including the discharge peak power or the charge peak power) to obtain the comparison power; or performing an averaging process on the ratio between the current actual power and the peak power to obtain the comparison power; or performing an averaging process on the ratio between the current actual power and the rated power (including the discharge rated power or the charge rated power) to obtain the comparison power, etc., just to name a few.

In other words, when determining the reference power and the comparison power, the method may be designed according to practical needs, as long as the reference power and the comparison power can be determined for the subsequent adjustment to the actual power. The disclosure does not intend to impose a specific limitation on the specific details of the determining method.

In practice, according to the embodiment of the disclosure, adjusting the actual power according to the reference power and the comparison power includes: adjusting the actual power according to the reference power and the comparison power under the condition that a predetermined control rule is satisfied. The predetermined control rule may include, within a prescribed time, an actual polarization voltage of the battery being not greater than a maximum polarization voltage of the battery, and an actual amount of accumulated heat of the battery being not greater than a maximum amount of accumulated heat of the battery. The prescribed power parameters include the discharge peak power or the charge peak power, and the prescribed time is the time adopted for obtaining the discharge peak power.

When considering the power properties of the battery, the following two factors require consideration:
1) the polarization voltage of the battery; and
2) the accumulated heat of the battery.

Assuming that the comparison power and the reference power are equal, the following relations need to be satisfied:

$$\Delta U_{max}(t0) \geq \Delta Us(t); \text{ and}$$

$$I_{max}^2 \times R \times t0 \geq Is^2 \times R \times t,$$

wherein t represents time, and the value range of t is set as [0, t0], t0 being the prescribed time, $\Delta U_{max}(t0)$ represents the maximum polarization voltage of the battery within the prescribed time, $\Delta Us(t)$ represents the actual polarization voltage of the battery within the arbitrary time t, $I_{max}^2 \times R \times t0$ represents the amount of accumulated heat of the battery within the prescribed time, $Is^2 \times t$ represents the actual amount of accumulated heat of the battery within the arbitrary time t, Is represents a current generated by the battery at the arbitrary time t, $I_{max}$ represents the maximum current generated by the battery, and R represents the internal resistance of the battery under a specific temperature, a specific SOC, and a specific current.

The prescribed time is the time adopted for obtaining the discharge peak power of the battery, and may be determined by referring to the Hybrid Pulse Power Characteristic (HPPC) test when determining the discharge peak power of the battery. Therefore, the prescribed time is normally set as 30 s. However, the disclosure is not limited thereto, and the prescribed time may also be set based on practical situations.

Regarding the polarization voltage, due to the polarization phenomenon inside the battery, the battery may generate a polarization voltage through use of the battery. If the polarization voltage is higher, the performance of the battery is lower, and the power that is actual output is decreased.

Regarding the accumulated heat, the battery may generate heat through use of the battery. A larger amount of accumulated heat in the battery within the prescribed time indicates that the battery has generated a great amount of heat, so the temperature of the battery may increase. At this time, the internal structure of the battery may be damaged, and the performance of the battery may thus be affected.

Therefore, regardless of the polarization voltage or the accumulated heat, an excessive high value will lead to an adverse effect to the performance of the battery. Therefore, to ensure that the battery operates normally to provide more electric energy to the electric vehicle under the condition that the performance remains favorable, the control rule needs to be satisfied during the process of controlling the output power of the battery, so as to facilitate the performance and increase the endurance of the battery.

In practice, according to the embodiment of the disclosure, adjusting the actual power according to the reference power and the comparison power includes: controlling the maximum power output by the battery to be not greater than the discharge peak power or to drop the maximum power to the discharge rated power according to the discharge reference power and the discharge comparison power if the battery is currently in a discharging stage, the actual power is a discharge actual power, the reference power is the discharge reference power, the comparison power is the discharge comparison power, and the prescribed power parameters include the discharge peak power or the discharge rated power; or controlling the maximum power fed back to the battery to be not greater than the charge peak power or to drop the maximum power to the charge rated power according to the charge reference power and the charge comparison power if the battery is currently in a charging stage, the actual power is a charge actual power, the reference power is the charge reference power, the comparison power is the charge comparison power, and the prescribed power parameters include the charge peak power or the charge rated power.

The actual power of the battery may include: the actual power output by the battery during the discharge process and the actual power fed back to the battery during the charge process.

Therefore, regarding the discharge process, the maximum power output by the battery may be construed as the maximum value in the actual power output by the battery, and regarding the charge process, the maximum power fed back to the battery may correspondingly be construed as the maximum value in the actual power fed back to the battery.

Consequently, when the battery is applied to the electric vehicle, the needs of the electric vehicle for power may be associated with the actual charge and discharge capabilities of the battery. Thus, the maximum power output by/fed back to the battery can be dynamically switched between the discharge/charge peak power and the discharge/charge rated power. As a result, an optimized design for the power of the battery can be realized. Accordingly, the energy of the battery can be utilized effectively, and the battery can be prevented from being used excessively while ensuring that the energy released by the battery satisfies the need of the electric vehicle for power. Therefore, the embodiment of the disclosure exhibits crucial effects in facilitating the performance of the electric vehicle, avoiding an operation failure of the battery, elongating the lifetime of the battery, etc.

Optionally, in the embodiment of the disclosure, controlling the maximum power output by the battery to be not greater than the discharge peak power or to drop the maximum power to the discharge rated power according to the discharge reference power and the discharge comparison power specifically includes: determining whether the discharge comparison power is greater than N1 times of the discharge reference power; if the discharge comparison power is not greater than N1 times of the discharge reference power, controlling the maximum power output by the battery to be not greater than the discharge peak power; if the discharge comparison power is greater than N1 times of the discharge reference power, further determining whether the discharge comparison power is greater than N2 times of the discharge reference power; if the discharge comparison power is greater than N2 times of the discharge reference power, controlling the maximum power output by the battery to be not greater than the discharge rated power after controlling the power output by the battery to drop the power to the discharge rated power; and if the discharge comparison power is not greater than N2 times of the discharge reference power, controlling the maximum power output by the battery to be not greater than the discharge peak power. Controlling the maximum power fed back to the battery to be not greater than the charge peak power or to drop the power to the charge rated power according to the charge reference power and the charge comparison power specifically includes: determining whether the charge comparison power is less than N1 times of the charge reference power; if the charge comparison power is not less than N1 times of the charge reference power, controlling the absolute value of the maximum power fed back to the battery to be not greater than the absolute value of the charge peak power; if the charge comparison power is less than N1 times of the charge reference power, further determining whether the charge comparison power is less than N2 times of the charge reference power; if the charge comparison power is less than N2 times of the charge reference power, controlling the absolute value of the maximum power fed back to the battery to be not greater than the absolute value of the charge rated power after controlling the absolute value of the power fed back to the battery to drop the absolute value of the power to the absolute value of the charge rated power; if the charge comparison power is not less than N2 times of the charge reference power, controlling the absolute value of the maximum power fed back to the battery to be not greater than the absolute value of the charge peak power, N1 and N2 being positive numbers, and N1 being smaller than N2. Specifically, N1 and N2 are both positive numbers and less than 1.

According to the above, the maximum power which the battery allows to output can be dynamically switched between the discharge peak power and the absolute value of the charge peak power, and the maximum power input to the battery can be dynamically switched between the discharge rated power and the absolute value of the charge rated power. The design controls the power output of the battery while ensuring stable and effective use of the battery for a long time. Such design serves as an effective example for the applications of batteries in electric vehicles.

If the battery is applied to the electric vehicle, the discharge process may be construed as, but not limited to, the traveling process of the electric vehicle. At this time, the discharge peak power, the discharge rated power, and the current actual power during the discharge process may all be defined as positive values. Meanwhile, the charge process may be construed as, but not limited to, the braking process of the electric vehicle. At this time, the charge peak power, the charge rated power, and the current actual power during the charge process may all be defined as negative values. Accordingly, the charge process and the discharge process are distinguished from each other, so as to effectively control the power of the battery.

Of course, in practical situations, the charge peak power, the charge rated power, and the current actual power during the charge process may all be defined as positive values and may be set according to practical needs to satisfy the needs under various scenarios and provide flexibility in design.

Besides, in correspondence with the different methods for determining the reference power and the comparison power, the adjustment made to the actual power may differ. Here, the descriptions are made, as example, by using the reference power and the comparison power determined according to Method 1 and Method 2 described above.

Situation 1: Regarding the reference power and the comparison power determined according to Method 1, the discharge process of the battery is described in the following as an example.

Whether the discharge comparison power is greater than a first threshold is determined.

Since the discharge comparison power determined according to Method 1 is obtained according to the integral of the difference between the current actual power and the discharge rated power, whether the discharge comparison power is greater than the first threshold may be first determined, and then whether the discharge comparison power is greater than N1 times of the discharge reference power is determined, so as to accurately control the actual power output by the battery.

Regarding the value of the first threshold, the value may be set as 0 or other values, and may be set according to practical situations. The disclosure is not particularly limited in this regard.

If the discharge comparison power is not greater than the first threshold, when the first threshold is zero, the current output power of the battery is less than the discharge rated power. At this time, for the ease of control, the discharge comparison power may be construed as zero. In addition, in order to allow the electric vehicle to accelerate, climb uphill, etc., during traveling, the maximum power which the battery allows to output may be controlled as the discharge peak power.

If the discharge comparison power is greater than the first threshold, when the first threshold is zero, the current output power of the battery is greater than the discharge rated power. At this time, whether the discharge comparison power is greater than N1 times of the discharge reference power may be further determined.

If the discharge comparison power is not greater than N1 times of the discharge reference power, the current output power of the battery is not the discharge peak power, and the output power is closer to the discharge rated power. Therefore, the maximum power output by the battery may be controlled to be not greater than the discharge peak power, so that the electric vehicle can accelerate, climb uphill, etc., during traveling.

If the discharge comparison power is greater than N1 times of the discharge reference power, whether the discharge comparison power is greater than N2 times of the discharge reference power may be further determined.

If the discharge comparison power is greater than N2 times of the discharge reference power, the current output power of the battery is relatively large, and the output power is possibly the discharge peak power. If the battery outputs a greater power for a long time, the battery may be used excessively, the power may be lost rapidly, and the polarization voltage and the amount of accumulated heat of the battery may increase, which cause adverse effects to the performance of the battery. Therefore, at this time, the output power of the battery may be controlled to drop to the discharge rated power, then the maximum power output by the battery may be controlled to be not greater than the discharge rated power.

If the output power of the battery is to be dropped from the current output power to the discharge rated power, to ensure smooth transition of the output power of the battery and stable traveling of the electric vehicle, such a process may specifically include controlling the battery to smoothly drop the output power from the current output power to the discharge rated power at a first predetermined rate.

In addition, the value of the first predetermined rate is not particularly limited herein, but may be set according to practical situations, so as to satisfy the needs under various scenarios and provide flexibility in design.

If the discharge comparison power is not greater than N2 times of the discharge reference power, the maximum power output by the battery may be controlled to be not greater than the discharge peak power, so that the electric vehicle can accelerate, climb uphill, etc., during traveling.

Figure 2:
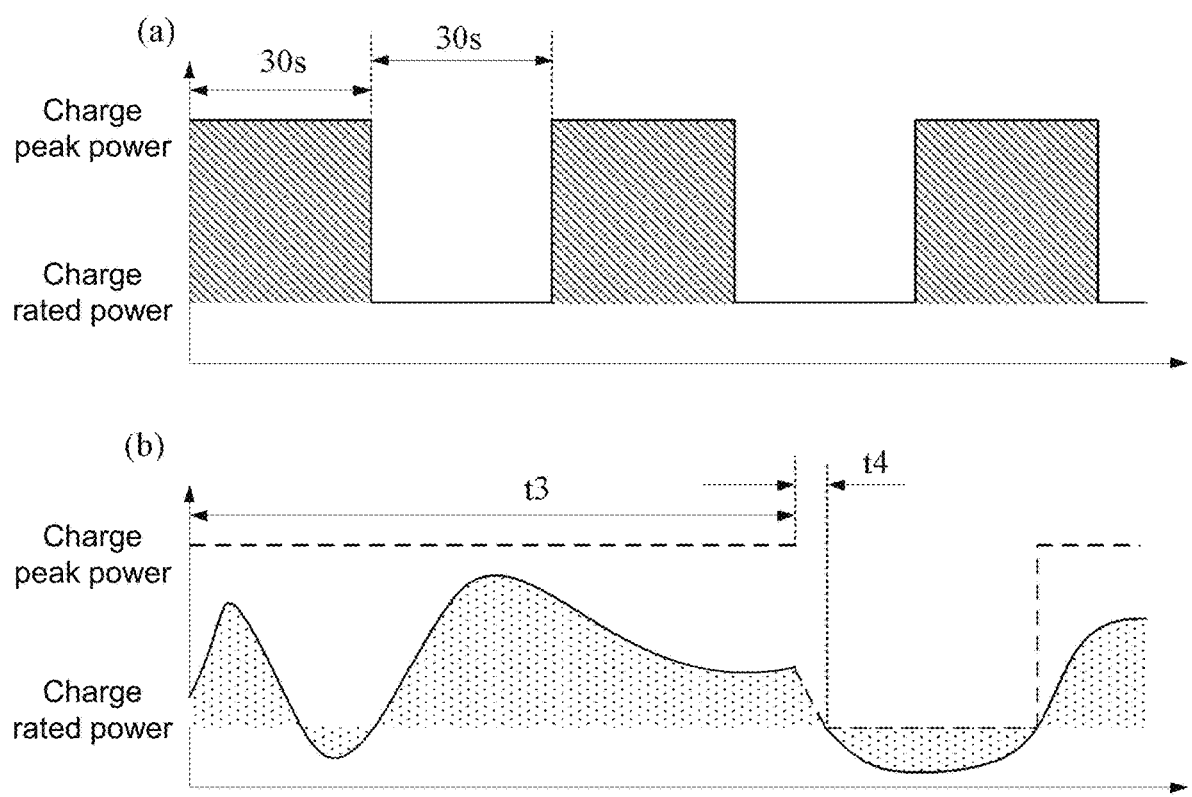
FIG. 2 is a schematic diagram illustrating dynamically adjusting a battery output power according to an embodiment of the disclosure.

For example, as shown in FIG. 2, part (a) in FIG. 2 is a schematic diagram illustrating the output power of the battery during an experimental stage, and part (b) in FIG. 2 is a schematic diagram illustrating the output power of the battery during the operating mode.

In part (a) of FIG. 2, the duration during which the battery outputs the discharge peak power is 30 s, and the duration during which the battery outputs the discharge rated power is also 30 s. The battery alternately outputs the discharge peak power and the discharge rated power. In addition, the regions filled with oblique lines represent the discharge reference power.

In part (b) of FIG. 2, the broken line represents the power which the battery is able to undertake, that is, the maximum power which the battery allows to output. The regions filled with sparse dots represent the discharge comparison power. There are two time intervals, which are t3 and t4, before the output power of the battery becomes the discharge rated power. t3 may be, but not limited to, greater than or equal to 24 s, and t4 may be, but not limited to, less than or equal to 12 s. During the time interval t4, the power output by the battery drops at the first predetermined rate until the discharge rated power.

By controlling and adjusting the power output by the battery, the power output by the battery varies within the power range which the battery is able to undertake, the power output by the battery is controlled while the battery is ensured to operate effectively and normally. Accordingly, an optimized design of the operating mode of the battery is realized.

Similarly, the charge process of the battery follows a principle similar to the principle described in the above example. As the details have been described above, the same details will not be reiterated in the following.

Before determining whether the charge comparison power is less than N1 times of the charge reference power, whether the charge comparison power is less than a second threshold also needs to be determined first. The charge comparison power, the charge peak power, and the current actual power of the battery in the charging stage of the battery are all negative values.

Regarding the value of the second threshold, the value may be set as 0 or other values, and may be set according to practical situations. The disclosure is not particularly limited in this regard.

If the charge comparison power is not less than the second threshold, when the second threshold is zero, the current power fed back to the battery is less than the charge rated power. At this time, for the ease of control, the charge comparison power may be construed as zero. In addition, the maximum power fed back to the battery may be controlled as the charge peak power.

If the charge comparison power is less than the second threshold, whether the discharge comparison power is greater than N1 times of the discharge reference power may be further determined.

In addition, depending on the discharge process, controlling the absolute value of the power fed back to the battery to drop the absolute value of the power to the absolute value of the charge rated power may be realized by controlling the absolute value of the current power fed back to the battery to drop smoothly to the absolute value of the charge rated power at a second predetermined rate.

In addition, the value of the second predetermined rate is not particularly limited. The first predetermined rate and the second predetermined rate may be set to be the same or different, and may be set according to practical situations, so as to satisfy the needs under various scenarios and provide flexibility in design.

Figure 3:
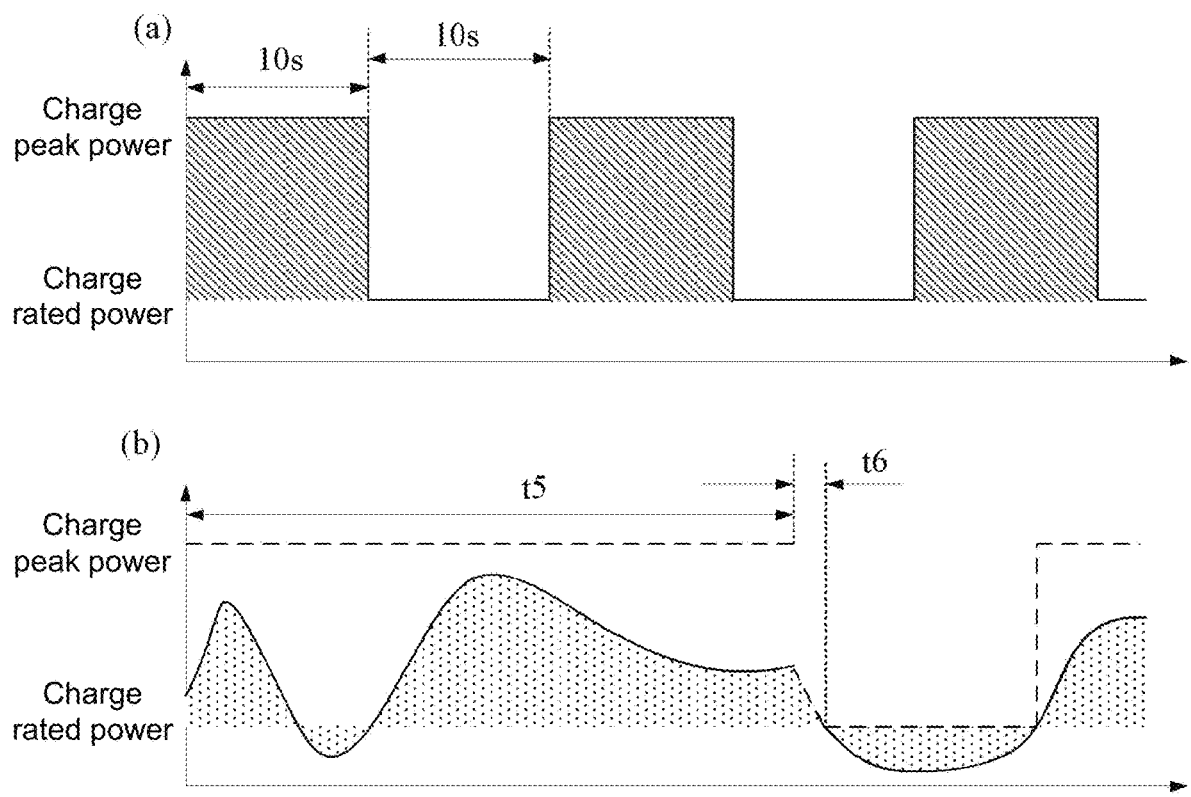
FIG. 3 is a schematic diagram illustrating dynamically adjusting a power fed back to a battery according to an embodiment of the disclosure.

As shown in FIG. 3, part (a) in FIG. 3 is a schematic diagram illustrating the absolute value of the power fed back to the battery during the experimental stage, and part (b) in FIG. 3 is a schematic diagram illustrating the absolute value of the power fed back during the operating mode of the battery.

In part (a) of FIG. 3, the duration during which the charge peak power is fed back to the battery is 30 s, and the duration during which the charge rated power is fed back is also 30 s. The absolute value of the charge peak power and the absolute value of the charge rated power are alternately fed back to the battery. In addition, the regions filled with oblique lines represent the absolute value of the charge reference power.

In part (b) of FIG. 3, the broken line represents the absolute value of the power which the battery is able to undertake, that is, the absolute value of the maximum power fed back to the battery. The regions filled with sparse dots represent the absolute value of the charge comparison power. There are also two time intervals, which are t5 and t6, before the absolute value of the power fed back to the battery becomes the absolute value of the charge rated power. t5 may be, but not limited to, greater than or equal to 8 s, and t6 may be, but not limited to, less than or equal to 4 s. During the time interval t6, the absolute value of the power fed back to the battery drops at the second predetermined rate until the absolute value of the charge rated power.

By controlling and adjusting the power fed back to the battery, the power fed back to the battery varies within the power range which the battery is able to undertake, and the power output to the battery is controlled and optimized while the battery is ensured to operate effectively and normally.

In the embodiment of the disclosure, when setting the values of N1 and N2, the smooth transition of the power output by the battery needs to be considered to ensure normal and stable traveling of the electric vehicle, while the wearing of the battery and the impact on the lifetime of the battery when the battery operates at full power for a long time also needs to be taken into consideration.

Therefore, the values of N1 and N2 may be set based on the needs according to actual road conditions, such as road conditions in the mountains, cities, suburbs, etc., and may be determined by modulating the calibration parameters and adjusting the output times of the peak power and the rated power, so as to be adapted to various road conditions.

Situation 2: Regarding the reference power and the comparison power determined in Method 2, since the reference power is obtained after performing an integral process on the peak power, the comparison power is obtained after performing an integral process on the actual power, and no difference is involved, it is not necessary to determine whether the discharge comparison power is greater than zero or it is not necessary to determine whether the charge comparison power is less than zero, and whether the discharge comparison power is greater than N1 times of the discharge reference power may be directly determined or whether the charge comparison power is less than N1 times of the charge reference power may be directly determined.

How the values of N1 and N2 may be different from how the values of N1 and N2 are set in Situation 1, and the values of N1 and N2 in Situation 2 may be set according to practical situations. In addition, the setting of the values of N1 and N2 in different situations may be similar. Details in this regard have been described in the foregoing, so the same details will not be reiterated in the following.

Optionally, in the embodiment of the disclosure, after determining that the discharge comparison power is not greater than N1 times of the discharge reference power and before controlling the maximum power output by the battery to be not greater than the discharge peak power, the embodiment further includes maintaining the value of a first flag representing a discharge degree at a first initial value. In addition, after determining that the discharge comparison power is greater than N2 times of the discharge reference power and before controlling the power output by the battery to drop the power to the discharge rated power, the embodiment further includes setting the value of the first flag as a first predetermined value. Or, after determining that the charge comparison power is not less than N1 times of the charge reference power and before controlling the absolute value of the maximum power fed back to the battery is not greater than the absolute value of the charge peak power, the embodiment further includes maintaining the value of a second flag representing a charge degree at a second initial value. In addition, after determining that the charge comparison power is less than N2 times of the charge reference power and before controlling the absolute value of the power fed back to the battery to drop the absolute value of the power to the absolute value of the charge rated power, the embodiment further includes setting the value of the second flag as a second predetermined value.

In other words, by introducing the first flag during the discharge process, after determining that the discharge comparison power is not greater than N1 times of the discharge reference power, the current actual power output situation of the battery can be labeled by using the value of the first flag, so as to make a determination quickly in the subsequent adjustment and control processes, thereby making the adjustment and control more efficient.

Similarly, by introducing the second flag during the charge process, after determining that the charge comparison power is not greater than N1 times of the charge reference power, the current actual power feedback situation of the battery can be labeled by using the value of the second flag, so as to make a determination quickly in the subsequent adjustment and control processes, thereby making the adjustment and control more efficient.

Furthermore, in the embodiment of the disclosure, after determining that the discharge comparison power is greater than N1 times of the discharge reference power, the embodiment further includes determining whether the value of the first flag is the first initial value. If the value of the first flag is the first initial value, whether the discharge comparison power is greater than N2 times of the discharge reference power is determined. If the value of the first flag is not the first initial value, the maximum power output by the battery is controlled to be not greater than the discharge rated power after controlling the power output by the battery to drop the power to the discharge rated power. Or, after determining that the charge comparison power is less than N1 times of the charge reference power, the embodiment further includes determining whether the value of the second flag is the second initial value. If the value of the second flag is the second initial value, whether the charge comparison power is less than N2 times of the charge reference power is determined. If the value of the second flag is not the second initial value, the absolute value of the maximum power fed back to the battery is controlled to be not greater than the absolute value of the charge rated power after controlling the absolute value of the power fed back to the battery to drop the absolute value of the power to the absolute value of the charge rated power.

In other words, in the discharge process, after determining that the discharge comparison power is greater than N1 times of the discharge reference power, a quick determination may be made according to the value of the first flag, so as to determine whether to control the power output by the battery to drop the power to the discharge rated power, thereby facilitating the dynamic switching efficiency, i.e., facilitating the efficiency to adjust and control the power of the battery, while realizing dynamic switching of the maximum power output by the battery between the discharge peak power and the discharge rated power.

Similarly, in the charge process, after determining that the charge comparison power is greater than N1 times of the charge reference power, a quick determination may be made according to the value of the second flag, so as to determine whether to control the absolute value of the power fed back to the battery to drop the absolute value of the power to the absolute value of the charge rated power, thereby facilitating the dynamic switching efficiency, i.e., facilitating the efficiency to adjust and control the power of the battery, while realizing control for the dynamic switching of the absolute value of the maximum power fed back to the battery between the absolute value of the charge peak power and the absolute value of the charge rated power.

In order to more reliably reflect the capability of the battery for supplying power, in the embodiment of the disclosure, the prescribed power parameters obtained in Step S101 may be power parameters after correction. That is, the prescribed power parameters include a corrected discharge peak power, a corrected discharge rated power, a corrected charge peak power, and a corrected charge rated power.

In other words, a battery health state index may be determined according to the internal resistance and the current power of the battery, and the battery health state index may serve as a correction index to correct the initial power parameters by using the correction index. The internal resistance of the battery reflects the aging property of the battery. Therefore, the initial power parameters may be corrected according to the aging property of the battery. By doing so, the capability of the battery for supplying power can be more reliably reflected, so that the battery can exhibit outstanding performance, and the energy supplied by the battery can be utilized sufficiently and effectively.

Therefore, the discharge peak power described above may be replaced by the corrected discharge peak power, the discharge rated power may be replaced by the corrected discharge rated power, the charge peak power may be replaced by the corrected charge peak power, and the charge rated power may be replaced by the corrected charge rated power.

Specifically, a method for determining the power parameters after correction may include:

Step 1: Determine the initial power parameters of the battery under different temperatures and different SOCs.

The initial power parameters may include the initial discharge peak power, the initial discharge rated power, the initial charge peak power, and the initial charge rated power.

The two indexes, i.e., temperature and SOC, may be set based on practical needs, as long as the initial power parameters can be accurately determined. The disclosure is not particularly limited in this regard.

Step 2: Determine the battery health state index of the battery according to the internal resistance and the current power of the battery.

The current power of the battery may be construed as the actual power of the battery at the current moment. For example, if the battery is in the discharging stage, the current power of the battery is the actual power at a moment in the discharging stage. If the battery is in the charging stage, the current power of the battery is the actual power at a moment in the charging stage.

Step 3: Correct the initial power parameters according to the battery health state index to obtain the SOP of the battery.

The corrected initial power parameters may include the corrected discharge peak power, the corrected discharge rated power, the corrected charge peak power, and the corrected charge rated power.

The SOP of the battery may be construed as the maximum power which the battery is able to undertake under a time t (any time), a specific temperature T, and a specific SOC. In other words, under the specific temperature and the specific SOC, the maximum power which the battery is able to undertake varies as time varies. The maximum power which the battery is able to undertake may be the peak power or the rated power, depending on the different scenarios. The corrected initial power parameters are able to represent the capability of the battery for supplying power and therefore able to reflect the performance of the battery.

In practice, the battery may include a plurality of battery cells. The battery cells may be connected in serial and parallel connection to form the battery.

At this time, in order to carry out Step 1, determining the initial power parameters of the battery under different temperatures and different SOCs according to the embodiment of the disclosure specifically includes: adopting a predetermined power test method to calculate first power parameters of each battery cell under different temperatures and different SOCs, the first power parameters including a first discharge peak power, a first discharge rated power, a first charge peak power, and a first charge rated power; smoothing the first power parameters that are calculated to obtain second power parameters of each battery cell under different temperatures and difference SOCs; determining the initial power parameters of the battery under different temperatures and different SOCs based on the serial/parallel connection relationship among the respective battery cells according to the second power parameters of each battery cell that are obtained.

With the simple processes as described above, the initial power parameters can be determined. The above processes not only facilitate the efficiency of determining the SOP but also increase the accuracy of the SOP of the battery, so that the SOP better fits the performance of the battery.

The predetermined power test method may be the HPPC test method for batteries. Of course, the predetermined power test method may also be other methods for testing the first power parameters of the respective battery cells under different temperatures and different SOCs that are well-known by people skilled in the art. The disclosure shall not be limited in this regard.

Moreover, optionally, in the embodiment of the disclosure, when smoothing the first power parameters that are calculated, linear interpolation may be carried out for smoothing, so that the power can be output smoothly. Meanwhile, a sudden change or a jump in the data of two adjacent intervals is avoided to prevent the accuracy of the determined SOP from dropping due to the sudden change or the jump, thereby increasing the accuracy in determining the SOP. Accordingly, reference data that are more valuable can be provided for the applications of the battery.

Figure 4:
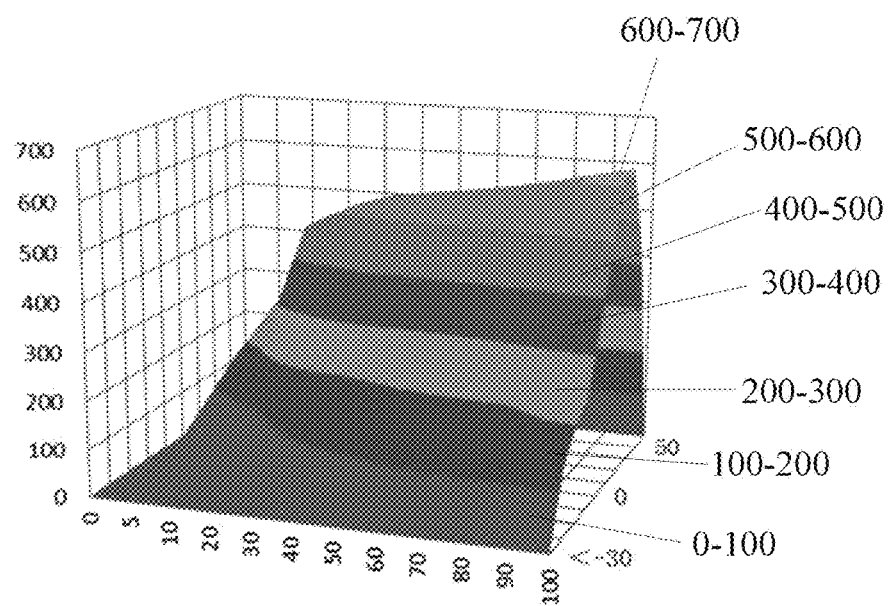
FIG. 4 is a schematic view illustrating results of discharge peak power of a battery cell under different temperatures and different states of charge (SOCs).
Figure 5:
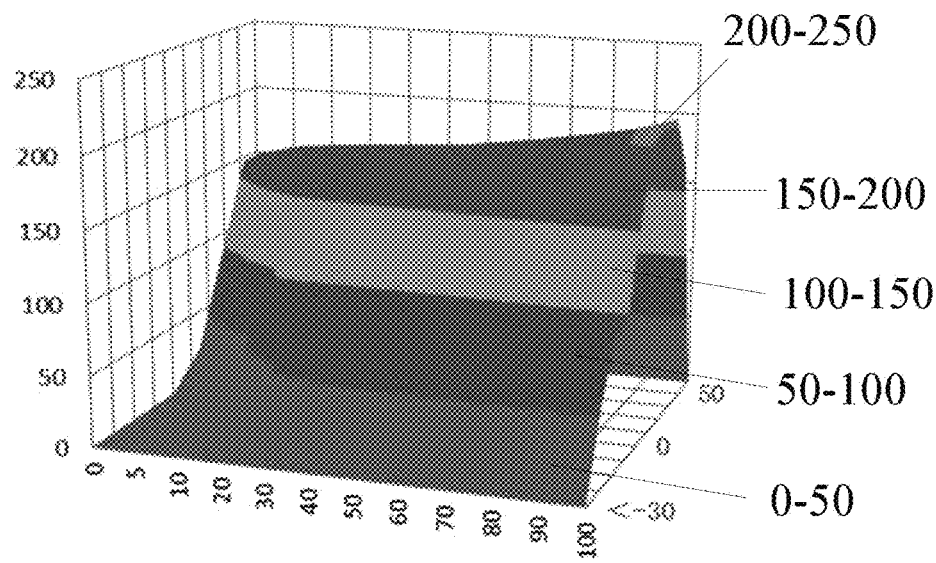
FIG. 5 is a schematic view illustrating results of discharge rated power of a battery cell under different temperatures and different SOCs.
Figure 6:
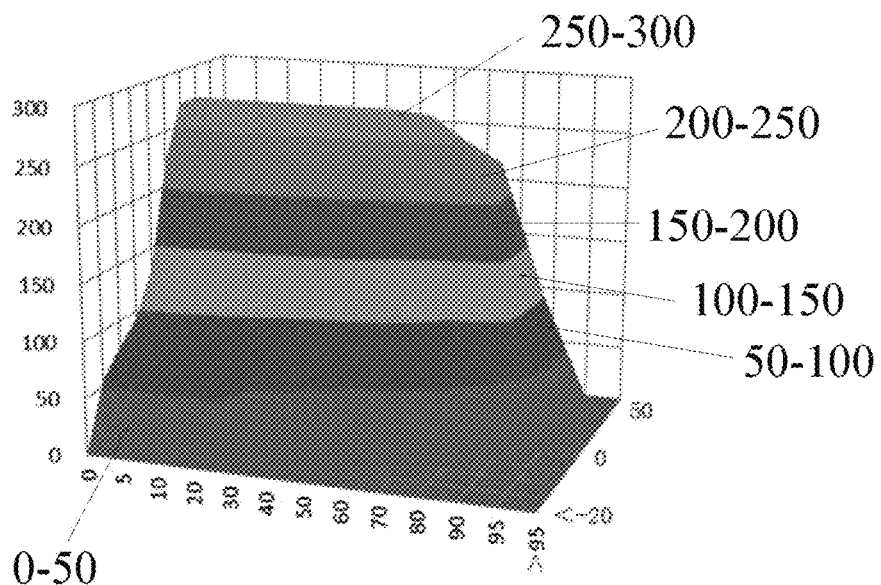
FIG. 6 is a schematic view illustrating results of charge peak power of a battery cell under different temperatures and different SOCs.
Figure 7:
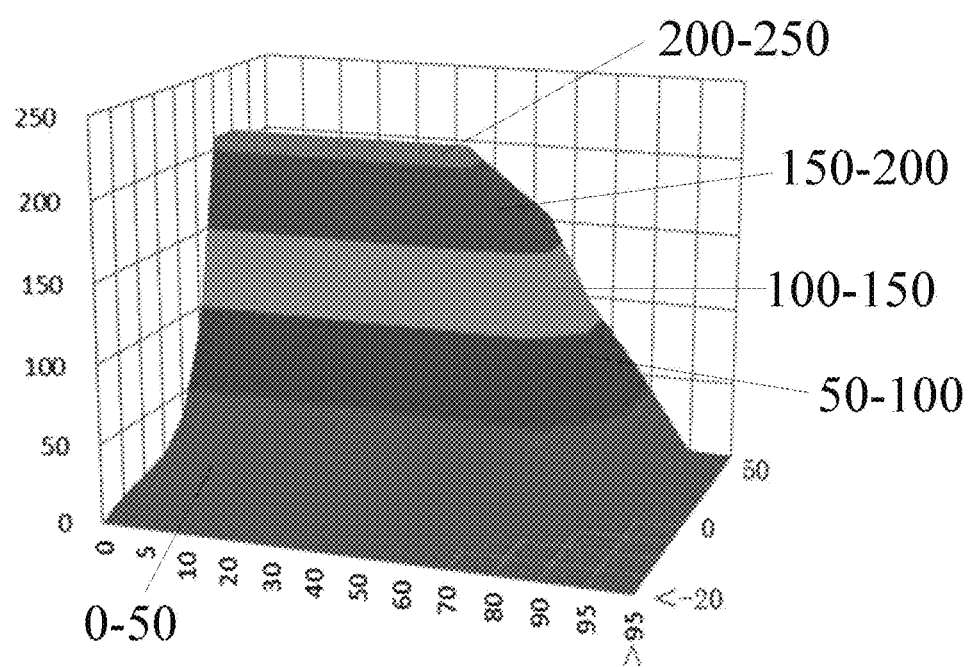
FIG. 7 is a schematic view illustrating results of charge rated power of a battery cell under different temperatures and different SOCs.

The results after processing are as shown in FIGS. 4 to 7. FIG. 4 illustrates the discharge peak power of the battery cell under different temperatures and different SOCs. FIG. 5 illustrates the discharge rated power of the battery cell under different temperatures and different SOCs. FIG. 6 illustrates the charge peak power of the battery cell under different temperatures and different SOCs. FIG. 7 illustrates the charge rated power of the battery cell under different temperatures and different SOCs. The results illustrated in FIGS. 4 to 7 clearly indicate the second power parameters of the battery cell under different temperatures and different SOCs, and the initial power parameters can be conveniently determined by using the second power parameters.

In addition, optionally, the initial power parameters of the battery may be determined by calculating according to the following equations:

$$Pc\text{-}m'(SOC,T,t11)=S1 \times S2 \times P0\text{-}c\text{-}m'(SOC,T,t11);$$

$$Pd\text{-}m'(SOC,T,t31)=S1 \times S2 \times P0\text{-}d\text{-}m'(SOC,T,t31);$$

$$Pc\text{-}r'(SOC,T,t21)=S1 \times S2 \times P0\text{-}c\text{-}r'(SOC,T,t21);$$

$$Pd\text{-}r'(SOC,T,t41)=S1 \times S2 \times P0\text{-}d\text{-}r'(SOC,T,t41);$$

wherein T represents the temperature, SOC represents the state of charge, S1 represents the number of battery cells connected in series in the battery, S2 represents the number of battery cells connected in parallel in the battery, P0-c-m' (SOC, T, t11) represents the initial charge peak power of the battery cell when the temperature is T, the state of charge is SOC, and the time of applying the charge pulse power is t11, P0-d-m'(SOC, T, t31) represents the initial discharge peak power of the battery cell when the temperature is T, the state of charge is SOC, and the time of applying the discharge pulse power is t31, P0-c-r'(SOC, T, t21) represents the initial charge rated power of the battery cell when the temperature is T, the state of charge is SOC, and the time of applying the charge pulse power is t21, P0-d-r'(SOC, T, t41) represents the initial discharge rated power of the battery cell when the temperature is T, the state of charge is SOC, and the time of applying the discharge pulse power is t41, Pc-m'(SOC, T, t11) represents the initial charge peak power before correction when the temperature is T, the state of charge is SOC, and the time of applying the charge pulse power is t11, Pc-r'(SOC, T, t21) represents the initial charge rated power before correction when the temperature is T, the state of charge is SOC, and the time of applying the charge pulse power is t21, Pd-m'(SOC, T, t31) represents the initial discharge peak power before correction when the temperature is T, the state of charge is SOC, and the time of applying the discharge pulse power is t31, and Pd-r'(SOC, T, t41) represents the initial discharge rated power before correction when the temperature is T, the state of charge is SOC, and the time of applying the discharge pulse power is t41.

In practice, in order to carry out Step 2, determining the battery health state index according to the internal resistance and the current power of the battery according to the embodiment of the disclosure specifically includes: calculating the battery health state index of the battery by adopting formulae as follows:

$$P_{11}=U_{max}\times[(C_1-U_{max})/D_c] \quad \text{Formula 1,}$$

$$\text{or } P_{21}=U_{min}\times[(C_1-U_{min})/D_d] \quad \text{Formula 2;}$$

$$SOH=[(D_{EOL}-D)/(D_{EOL}-D_{BOL})]\times100\% \quad \text{Formula 3,}$$

wherein $P_{11}$ represents the current power when the battery is in the charging stage, $U_{max}$ represents a charge cutoff voltage of the battery, $C_1$ represents an open circuit voltage under any SOC, $D_c$ represents the internal resistance of the battery under the current charge power, $P_{21}$ represents the current power when the battery is in the discharging stage, $U_{min}$ represents a discharge cutoff voltage of the battery, $D_d$ represents the internal resistance of the battery under the current discharge power, SOH represents the battery health state index of the battery, $D_{EOL}$ represents the internal resistance when the lifetime of the battery ends, $D_{BOL}$ represents an initial internal resistance of the battery, D represents a current internal resistance of the battery, the current internal resistance of the battery when the battery is in the charging stage is the internal resistance of the battery under the current charge power, and the current internal resistance of the battery when the battery is in the discharging stage is the internal resistance of the battery under the current discharge power.

In practical situations, if the battery is in the charge state, only the calculation based on Formula 1 is required, and it is not necessary to conduct the calculation based on Formula 2, and if the battery is in the discharge state, only the calculation based on Formula 2 is required, and it is not necessary to conduct the calculation based on Formula 1. As a result, the power consumption of the system can be reduced.

In other words, regarding Formulae 1 to 3, when the battery is in the discharging stage, the internal resistance $D_d$ of the battery at a certain moment in the discharging stage is first determined according to Formula 2. The internal resistance $D_d$ so determined is then determined as the current internal resistance D of the battery, that is, $D=D_d$. Then, by substituting the determined internal resistance $D_d$ into Formula 3, the battery health state index of the battery at the moment can be determined.

When the battery is in the charging stage, the internal resistance $D_c$ of the battery at a certain moment in the charging stage is first determined according to Formula 1. The internal resistance $D_c$ so determined is then determined as the current internal resistance D of the battery, that is, $D=D_c$. Then, by substituting the determined internal resistance $D_c$ into Formula 3, the battery health state index of the battery at the moment can be determined.

The internal resistance property of the battery affects the output power of the battery. Therefore, the internal resistance property is one of the important parameters for evaluating the SOP of the battery, and the battery health state index reflects the aging degree of the battery.

Therefore, the formulae (e.g., Formula 1 and Formula 2) for determining P11 and P21 can be derived based on the test method of HPPC based on the battery equivalent circuit model (i.e., the Rint model). Since $C_1$ under a specific SOC may be set as a fixed value, $U_{max}$ may be set as a fixed value, and $U_{min}$ may be set as a fixed value, it can be determined that the internal resistance of the battery is negatively correlated with the current power (including the current charge power and the current discharge power) of the battery.

In other words, the current power of the battery is lower if the internal resistance of the battery is higher, whereas the current power of the battery is higher if the internal resistance of the battery is lower.

Therefore, through the relationship between internal resistance and power, it can be determined that the internal resistance of the battery and the current power of the battery are in a linear relationship.

In addition, since internal resistance is commonly used as a characteristic in determining the health state index of a battery, the formula for determining SOH (i.e., Formula 3) can be derived. Since $D_{EOL}$ may be set as a fixed value, and $D_{BOL}$ may be set as a fixed value, it can be determined that SOH is negatively correlated with the current internal resistance of the battery.

In other words, SOH is smaller if the internal resistance of the battery is higher, whereas SOH is greater if the internal resistance of the battery is lower.

Therefore, through the relationship between internal resistance and SOH, it can be determined that the internal resistance of the battery and SOH are in a linear relationship.

On such basis, it can be determined that SOH and the current power of the battery are in a linear relationship according to Formulae 1 to 3. Therefore, SOH can be determined according to the current power of the battery. When the initial power parameters are corrected by using the SOH so determined, the correction according to the aging degree of the battery can be realized. Consequently, the results after correction can more accurately reflect the performance of the battery, thereby alleviating the deviation between the SOP of the battery that is determined and the practical situations.

In practice, in order to carry out Step 3, when the battery health state index includes a first index, a second index, a third index and a fourth index and the initial power parameters includes the initial discharge peak power, the initial discharge rated power, the initial charge peak power, and the initial charge rated power, according to the embodiment of the disclosure, correcting the initial power parameters according to the battery health state index includes: multiplying the initial discharge peak power by the first index to obtain the corrected discharge peak power; multiplying the initial discharge rated power by the second index to obtain the corrected discharge rated power; multiplying the initial charge peak power by the third index to obtain the corrected charge peak power; and multiplying the initial charge rated power by the fourth index to obtain the corrected charge rated power.

Specifically, correcting the initial power parameters according to the battery health state index includes: respectively correcting the initial discharge peak power, the initial discharge rated power, the initial charge peak power, and the initial charge rated power according to formulae as follows:

$$Pc\text{-}m(SOC,T,t11)=SOH_1 \times Pc\text{-}m'(SOC,T,t11);$$

$$Pc\text{-}r(SOC,T,t21)=SOH_2 \times Pc\text{-}r'(SOC,T,t21);$$

$$Pd\text{-}m(SOC,T,t31)=SOH_3 \times Pd\text{-}m'(SOC,T,t31);$$

$$Pd\text{-}r(SOC,T,t41)=SOH_4 \times Pd\text{-}r'(SOC,T,t41),$$

wherein T represents the temperature, SOC represents the state of charge, Pc-m'(SOC, T, t11) represents the initial charge peak power before correction when the temperature is T, the state of charge is SOC, and the time of applying the charge pulse power is t11, Pc-m(SOC, T, t11) represents the corrected charge peak power after correction when the temperature is T, the state of charge is SOC, and the time of applying the charge pulse power is t11, Pc-r'(SOC, T, t21) represents the initial charge rated power before correction when the temperature is T, the state of charge is SOC, and the time of applying the charge pulse power is t21, Pc-r(SOC, T, t21) represents the corrected charge rated power after correction when the temperature is T, the state of charge is SOC, and the time of applying the charge pulse power is t21, Pd-m'(SOC, T, t31) represents the initial discharge peak power before correction when the temperature is T, the state of charge is SOC, and the time of applying the discharge pulse power is t31, Pd-m(SOC, T, t31) represents the corrected discharge peak power after correction when the temperature is T, the state of charge is SOC, and the time of applying the discharge pulse power is t31, Pd-r'(SOC, T, t41) represents the initial discharge rated power before correction when the temperature is T, the state of charge is SOC, and a time of applying the discharge pulse power is t41, Pd-r(SOC, T, t41) represents the corrected discharge rated power after correction when the temperature is T, the state of charge is SOC, and the time of applying the discharge pulse power is t41, $SOH_1$ represents the first index corresponding to the charge peak power, $SOH_2$ represents the second index corresponding to the charge rated power, $SOH_3$ represents the third index corresponding to the discharge peak power, and $SOH_4$ represents the fourth index corresponding to the discharge rated power.

In this way, after the initial power parameters are corrected according to the above, the results after correction can more accurately reflect the performance of the battery, thereby alleviating the deviation between the SOP of the battery that is determined and the practical situations. Consequently, the SOP of the battery can more reliably reflect the capability of the battery for supplying power, so that the battery can exhibit outstanding performance and the energy supplied by the battery can be utilized sufficiently and effectively.

Optionally, in the embodiment of the disclosure, t11 and t21 are related to the charge process of the battery, t31 and t41 are related to the discharge process of the battery, t11 and t31 are related to the peak power of the battery, and t21 and t41 are related to the rated power of the battery. Therefore, considering the properties of the battery, in order to prevent the battery from being maintained at the peak power and thus damaged and to ensure the battery is used normally, t11 and t31 may normally be set at 30 s. However, the disclosure is not limited thereto, and t11 and t31 may be set based on practical situations to satisfy the needs under various scenarios and provide flexibility in design.

Differing from t11 to t31, the values of t21 and t41 may be set to be quite large or small. That is, the values of t21 and t41 may be set based on practical situations to satisfy the needs under various scenarios and provide flexibility in design.

Optionally, in the embodiment of the disclosure, the first index, the second index, the third index, and the fourth index are the same.

Accordingly, the process for determining the battery health state index can be simplified, and the efficiency of determining the battery health state index can be facilitated. As a consequence, the efficiency of determining the SOP can be facilitated.

In practical situations, the first index, the second index, the third index, and the fourth index may also be set to be different from one another, and the specific values for the indexes are not particularly limited. Accordingly, the correction made to the respective power parameters can be customized and consequently can be more accurate, and the SOP of the battery can be more accurately determined.

Figure 8:
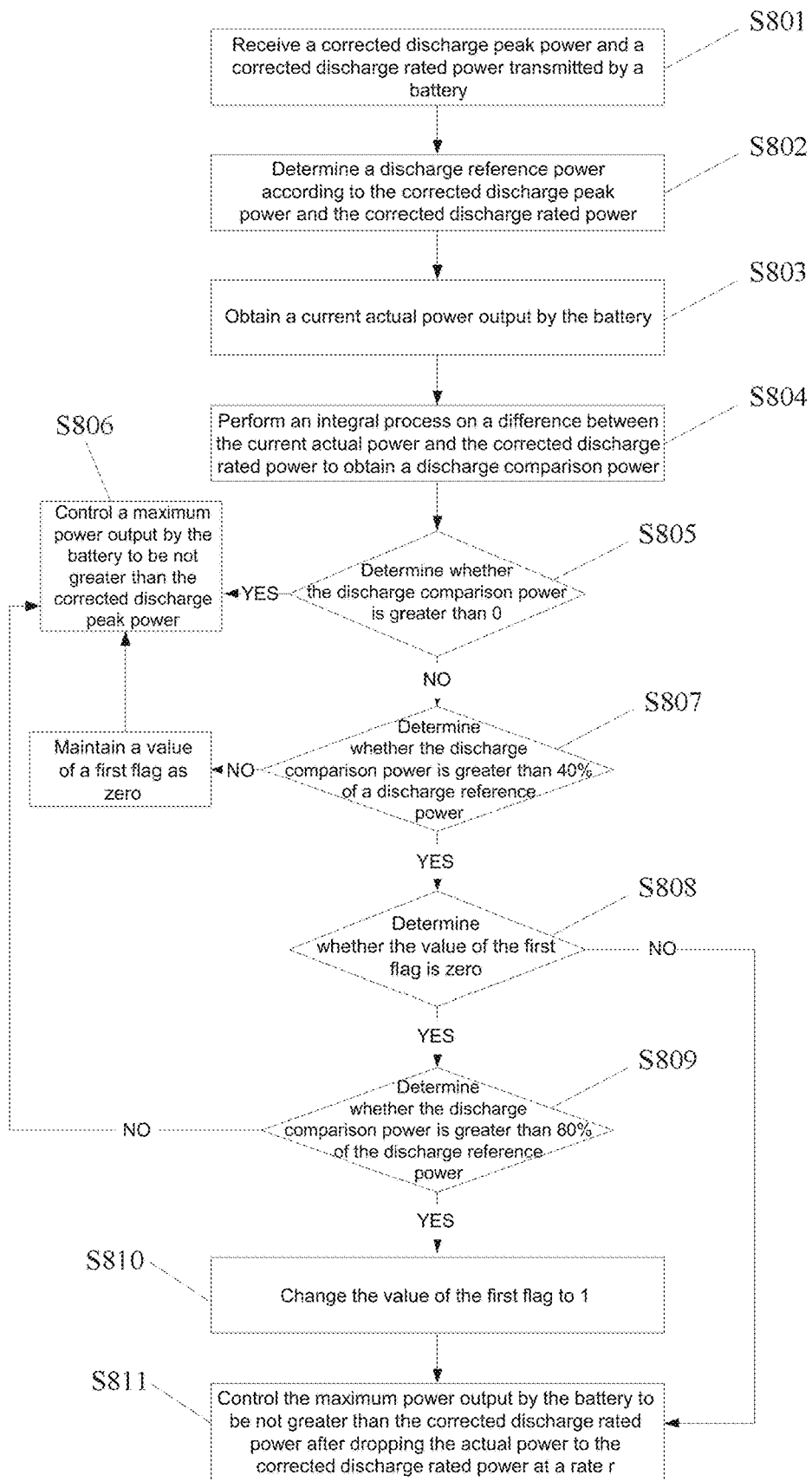
FIG. 8 is a flowchart illustrating a method according to Example 1.

Example 1: The following descriptions are made, as an example, according to the discharge process of the battery and the discharge reference power and the discharge comparison power determined according to Method 1. In the example, N1 is 40%, N2 is 80%, and the descriptions are made with reference to the flowchart of FIG. 8 illustrating a method.

S801: Receive the corrected discharge peak power and the corrected discharge rated power transmitted by the battery.

S802: Determine the discharge reference power according to the corrected discharge peak power and the corrected discharge rated power.

S803: Obtain the current actual power output by the battery.

S804: Perform an integral process on the difference between the current actual power and the corrected discharge rated power to obtain the discharge comparison power.

S805: Determine whether the discharge comparison power is greater than 0, perform Step S806 if the discharge comparison power is not greater than 0, and perform Step S807 if the discharge comparison power is greater than 0.

S806: Control the maximum power output by the battery to be not greater than the corrected discharge peak power and end the flow.

S807: Determine whether the discharge comparison power is greater than 80% of the discharge reference power, perform Step S808 if the discharge comparison power is greater than 80% of the discharge reference power, and maintain the value of the first flag as 0 and perform S806 if the discharge comparison power is not greater than 80% of the discharge reference power, wherein the initial value of the first flag may be set as 0.

S808: Determine whether the value of the first flag is 0, perform Step S809 if the value of the first flag is 0, and perform Step S811 if the value of the first flag is not 0.

S809: Determine whether the discharge comparison power is greater than 80% of the discharge reference power, perform Step S810 if the discharge comparison power is greater than 80% of the discharge reference power, and perform Step S806 if the discharge comparison power is not greater than 80% of the discharge reference power.

S810: Change the value of the first flag to 1.

S811: Control the maximum power output by the battery to be not greater than the corrected discharge rated power after dropping the actual power to the corrected discharge rated power at a rate r.

Figure 9:
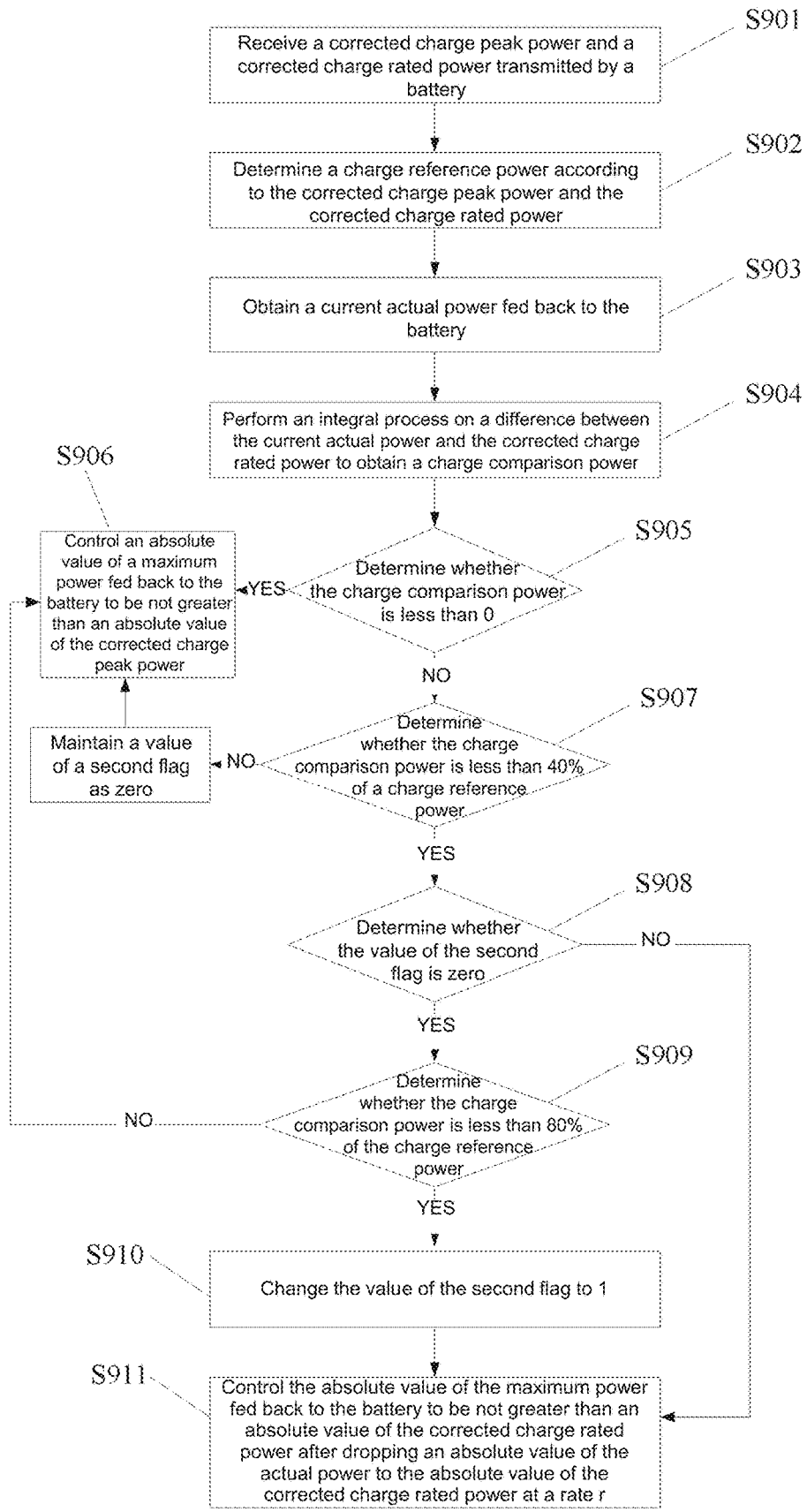
FIG. 9 is a flowchart illustrating a method according to Example 2.

Example 2: The following descriptions are made, as an example, according to the feedback process to the battery and the charge reference power and the charge comparison power determined according to Method 1. In the example, N1 is 40%, N2 is 80%, and the descriptions are made with reference to the flowchart of FIG. 9 illustrating a method.

S901: Receive the corrected charge peak power and the corrected charge rated power transmitted by the battery.

S902: Determine the charge reference power according to the corrected charge peak power and the corrected charge rated power.

S903: Obtain the current actual power fed back to the battery.

S904: Perform an integral process on the difference between the current actual power and the corrected charge rated power to obtain the charge comparison power.

S905: Determine whether the charge comparison power is less than 0, perform Step S906 if the charge comparison power is not less than 0; and perform Step S907 if the charge comparison power is less than 0.

S906: Control the absolute value of the maximum power fed back to the battery to be not greater than the absolute value of the corrected charge peak power and end the flow.

S907: Determine whether the charge comparison power is less than 40% of the charge reference power, perform Step S908 if the charge comparison power is less than 40% of the charge reference power, and maintain the value of the second flag as 0 and perform S906 if the charge comparison power is not less than 40% of the charge reference power, wherein the initial value of the second flag may be set as 0.

S908: Determine whether the value of the second flag is 0, perform Step S909 if the value of the second flag is 0, and perform Step S911 if the value of the second flag is not 0.

S909 Determine whether the charge comparison power is less than 80% of the charge reference power, perform Step S910 if the charge comparison power is less than 80% of the charge reference power, and perform Step S906 if the charge comparison power is not less than 80% of the charge reference power.

S910: Change the value of the second flag to 1.

S911: Control the absolute value of the maximum power fed back to the battery to be not greater than the absolute value of the corrected charge rated power after dropping the absolute value of the actual power to the absolute value of the corrected charge rated power at the rate r.

Based on the same inventive concept, an embodiment of the disclosure provides a control apparatus for a power of a battery. The principle for realizing the control apparatus is similar to the principle for realizing the method for controlling the power of the battery. Therefore, the specific details for implementing the control apparatus have been described above for the method controlling the power of the battery, and the same details will not be reiterated in the following.

Figure 13:
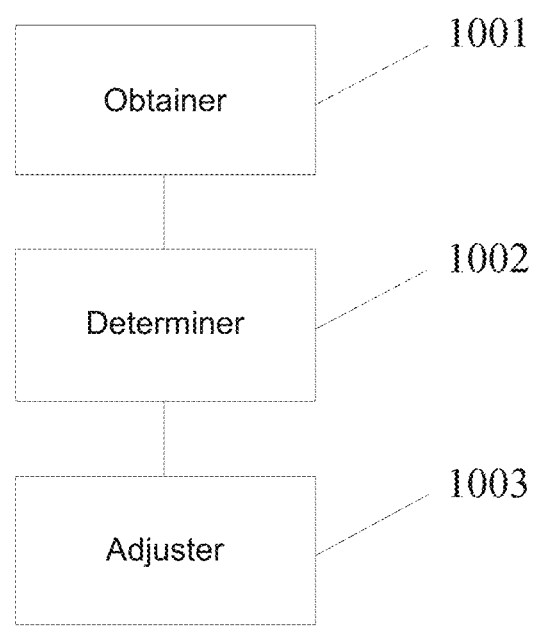
FIG. 13 is another schematic view illustrating a structure of a control apparatus for a power of a battery according to an embodiment of the disclosure.

Specifically, as shown in FIG. 13, the control apparatus for the power of the battery according to the embodiment of the disclosure includes: an obtainer 1001, configured for obtaining rated powers of the battery and a current actual power of the battery; and an adjuster 1003, configured for adjusting the actual power according to a difference between the rated powers and the current actual power when the current actual power is greater than or equal to the rated powers.

Figure 10:
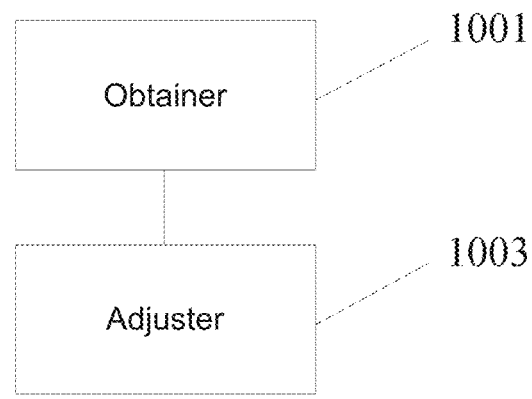
FIG. 10 is a schematic view illustrating a structure of a control apparatus for a power of a battery according to an embodiment of the disclosure.

Optionally, as shown in FIG. 10, the control apparatus for the power of the battery according to the embodiment of the disclosure includes an obtainer 1001, configured for obtaining the prescribed power parameters of the battery and the current actual power of the battery; a determiner 1002, configured for determining the reference power according to the prescribed power parameters; and determining a comparison power according to prescribed power parameters and current actual power; and the adjuster 1003, configured for adjusting the actual power according to the reference power and the comparison power.

Optionally, in the embodiment of the disclosure, the adjuster 1003 is configured for: controlling the maximum power output by the battery to be not greater than the discharge peak power or to drop the maximum power to the discharge rated power according to the discharge reference power and the discharge comparison power if the battery is currently in a discharging stage, the actual power is a discharge actual power, the reference power is the discharge reference power, the comparison power is the discharge comparison power, and the prescribed power parameters include the discharge peak power or the discharge rated power; or controlling the maximum power fed back to the battery to be not greater than the charge peak power or to drop the maximum power to the charge rated power according to the charge reference power and the charge comparison power if the battery is currently in a charging stage, the actual power is a charge actual power, the reference power is the charge reference power, the comparison power is the charge comparison power, and the prescribed power parameters include the charge peak power or the charge rated power.

Optionally, in the embodiment of the disclosure, the adjuster 1003 is configured for: determining whether the discharge comparison power is greater than N1 times of the discharge reference power; if the discharge comparison power is not greater than N1 times of the discharge reference power, controlling the maximum power output by the battery to be not greater than the discharge peak power; if the discharge comparison power is greater than N1 times of the discharge reference power, further determining whether the discharge comparison power is greater than N2 times of the discharge reference power; if the discharge comparison power is greater than N2 times of the discharge reference power, controlling the maximum power output by the battery to be not greater than the discharge rated power after controlling the power output by the battery to drop the power to the discharge rated power; and if the discharge comparison power is not greater than N2 times of the discharge reference power, controlling the maximum power output by the battery to be not greater than the discharge peak power. Specifically, the adjuster 1003 is configured for: determining whether the charge comparison power is less than N1 times of the charge reference power; if the charge comparison power is not less than N1 times of the charge reference power, controlling the absolute value of the maximum power fed back to the battery to be not greater than the absolute value of the charge peak power; if the charge comparison power is less than N1 times of the charge reference power, further determining whether the charge comparison power is less than N2 times of the charge reference power; if the charge comparison power is less than N2 times of the charge reference power, controlling the absolute value of the maximum power fed back to the battery to be not greater than the absolute value of the charge rated power after controlling the absolute value of the power fed back to the battery to drop the absolute value of the power to the absolute value of the charge rated power; if the charge comparison power is not less than N2 times of the charge reference power, controlling the absolute value of the maximum power fed back to the battery to be not greater than the absolute value of the charge peak power, N1 and N2 being positive numbers, and N1 being smaller than N2.

Optionally, in the embodiment of the disclosure, after determining that the discharge comparison power is not greater than N1 times of the discharge reference power and before controlling the maximum power output by the battery to be not greater than the discharge peak power, the adjuster 1003 is further configured for: maintaining the value of the first flag representing the discharge degree at the first initial value; and after determining that the discharge comparison power is greater than N2 times of the discharge reference power and before controlling the power output by the battery to drop the power to the discharge rated power, the adjuster 1003 is further configured for: setting the value of the first flag as the first predetermined value. Or, after determining that the charge comparison power is not less than N1 times of the charge reference power and before controlling the absolute value of the maximum power fed back to the battery is not greater than the absolute value of the charge peak power, the adjuster 1003 is further configured for: maintaining the value of the second flag representing the charge degree at the second initial value; and after determining that the charge comparison power is less than N2 times of the charge reference power and before controlling the absolute value of the power fed back to the battery to drop the absolute value of the power to the absolute value of the charge rated power, the adjuster 1003 is further configured for: setting the value of the second flag as the second predetermined value.

Optionally, in the embodiment of the disclosure, after determining that the discharge comparison power is greater than N1 times of the discharge reference power, the adjuster 1003 is further configured for: determining whether the value of the first flag is the first initial value; if the value of the first flag is the first initial value, determining whether the discharge comparison power is greater than N2 times of the discharge reference power; and if the value of the first flag is not the first initial value, controlling the maximum power output by the battery to be not greater than the discharge rated power after controlling the power output by the battery to drop the power to the discharge rated power. Or, after determining that the charge comparison power is less than N1 times of the charge reference power, the adjuster 1003 is further configured for: determining whether the value of the second flag is the second initial value; if the value of the second flag is the second initial value, determining whether the charge comparison power is less than N2 times of the charge reference power; and if the value of the second flag is not the second initial value, controlling the absolute value of the maximum power fed back to the battery to be not greater than the absolute value of the charge rated power after controlling the absolute value of the power fed back to the battery to drop the absolute value of the power to the absolute value of the charge rated power.

Optionally, in the embodiment of the disclosure, when the prescribed power parameters include the discharge peak power or the charge peak power and the prescribed power parameters further include the discharge rated power or the charge rated power, the determiner 1002 is specifically configured for: calculating the discharge reference power according to the difference between the discharge peak power and the discharge rated power; or calculating the charge reference power according to the difference between the charge peak power and the charge rated power; and performing an integral process on the difference between the current actual power and the discharge rated power to obtain the discharge comparison power; or performing an integral process on the difference between the current actual power and the charge rated power to obtain the charge comparison power.

Optionally, in the embodiment of the disclosure, when the prescribed power parameters include the discharge peak power or the charge peak power, the determiner 1002 is specifically configured for: performing an integral process on the discharge peak power to calculate the discharge reference power; or performing an integral process on the charge peak power to determine the charge reference power; and performing an integral process on the current actual power to obtain the discharge comparison power; or performing an integral process on the current actual power to obtain the charge comparison power.

Figure 11:
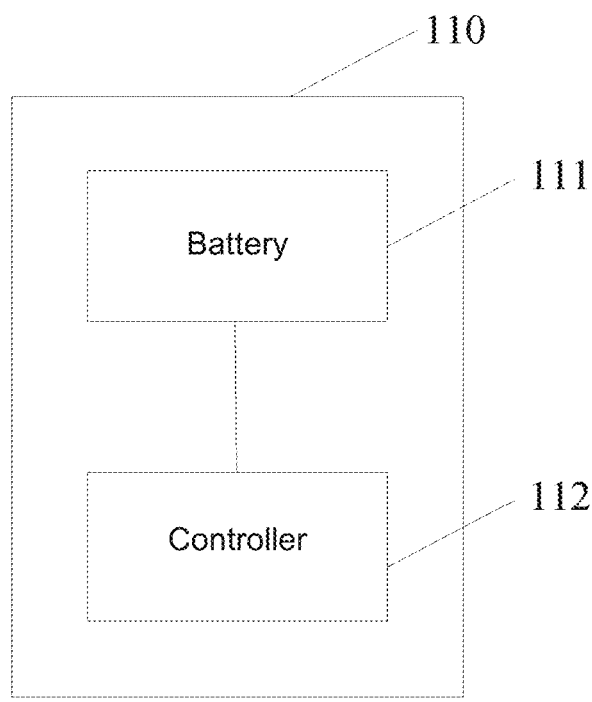
FIG. 11 is a schematic view illustrating a structure of an electric vehicle according to an embodiment of the disclosure.

Based on the same inventive concept, an embodiment of the disclosure provides an electric vehicle 110. As shown in FIG. 11, the electric vehicle 110 includes a battery 111 and a controller 112. The controller 112 includes the control apparatus according to the embodiment of the disclosure. Or, the controller 112 controls the power output by the battery 111 according to the method provided in the embodiment of the disclosure.

Of course, in addition to the battery and the controller, the electric vehicle further includes other structures (not shown in FIG. 11) that allow the electric vehicle to operate normally. The disclosure is not particularly limited in this regard.

It will be apparent to those skilled in the art that various modifications and variations can be made to the structure of the disclosure without departing from the scope or spirit of the disclosure. In view of the foregoing, it is intended that the disclosure cover modifications and variations of this disclosure provided they fall within the scope of the following claims and their equivalents.

Other embodiments of the disclosure will be apparent to those skilled in the art from consideration of the specification and practice of the disclosure disclosed herein. The disclosure is intended to cover any variations, uses or adaptations of the disclosure. These variations, uses, or adaptations follow the general principles of the disclosure and include common general knowledge or conventional technical means in the art that are not disclosed in the present disclosure. The specification and embodiments are illustrative.

What is claimed is:

1. A method for controlling a power of a battery, comprising:
   obtaining rated powers of the battery and a current actual power of the battery; and
   adjusting an actual power according to a difference between the rated powers and the current actual power when the current actual power is greater than or equal to the rated powers,
   wherein prescribed power parameters further comprise peak powers, the method further comprises:
   controlling a maximum power output by the battery to be not greater than the rated powers after controlling a power output by the battery to drop the power output to the rated powers when the current actual power is greater than the peak powers, wherein the method further comprises adjusting the actual power according to a reference power and a comparison power under a condition that a predetermined control rule is satisfied, wherein the predetermined control rule comprises:

within a prescribed time, an actual polarization voltage of the battery being not greater than a maximum polarization voltage of the battery, and an actual amount of accumulated heat of the battery being not greater than a maximum amount of accumulated heat of the battery, wherein the prescribed power parameters comprise a discharge peak power or a charge peak power, and the prescribed time is a time adopted for obtaining the charge peak power or the discharge peak power.

2. The method as claimed in claim 1, further comprising:

controlling the maximum power output by the battery to be not greater than the peak powers when the current actual power is less than the rated powers.

3. An electric vehicle, comprising a battery and a controller, wherein the controller controls a power of the battery according to the method as claimed in claim 2.

4. The method as claimed in claim 1, wherein adjusting the actual power according to the comparison power comprises:

controlling the maximum power output by the battery to be not greater than the peak powers, or to drop the power output to the rated powers according to the comparison power.

5. An electric vehicle, comprising a battery and a controller, wherein the controller controls a power of the battery according to the method as claimed in claim 4.

6. The method as claimed in claim 1, comprising:

obtaining the rated powers and the peak powers of the battery, and the current actual power of the battery;

determining a difference between the peak powers and the rated powers according to the rated powers and the peak powers;

construing the rated powers and/or the peak powers of the battery as the prescribed power parameters;

determining a difference between the current actual power and the prescribed power parameters according to the prescribed power parameters and the current actual power;

construing a difference between the peak powers and the rated powers as the comparison power, construing a difference between the current actual power and the prescribed power parameters as the reference power; and adjusting the actual power according to the reference power and the comparison power.

7. The method as claimed in claim 6, wherein adjusting the actual power according to the reference power and the comparison power comprises:

controlling the maximum power output by the battery to be not greater than a discharge peak power or to drop the maximum power to a discharge rated power according to a discharge reference power and a discharge comparison power if the battery is currently in a discharging stage, the actual power is a discharge actual power, the reference power is the discharge reference power, the comparison power is the discharge comparison power, and the prescribed power parameters comprise the discharge peak power or the discharge rated power; or controlling the maximum power fed back to the battery to be not greater than a charge peak power or to drop the maximum power to a charge rated power according to a charge reference power and a charge comparison power if the battery is currently in a charging stage, the actual power is a charge actual power, the reference power is the charge reference power, the comparison power is the charge comparison power, and the prescribed power parameters comprise the charge peak power or the charge rated power.

8. The method as claimed in claim 7, wherein controlling the maximum power output by the battery to be not greater than the discharge peak power or to drop the maximum power to the discharge rated power according to the discharge reference power and the discharge comparison power comprises:

determining whether the discharge comparison power is greater than N1 times of the discharge reference power;

if the discharge comparison power is not greater than N1 times of the discharge reference power, controlling the maximum power output by the battery to be not greater than the discharge peak power;

if the discharge comparison power is greater than N1 times of the discharge reference power, further determining whether the discharge comparison power is greater than N2 times of the discharge reference power;

if the discharge comparison power is greater than N2 times of the discharge reference power, controlling the maximum power output by the battery to be not greater than the discharge rated power after controlling a power output by the battery to drop the power to the discharge rated power; and if the discharge comparison power is not greater than N2 times of the discharge reference power, controlling the maximum power output by the battery to be not greater than the discharge peak power; and controlling the maximum power fed back to the battery to be not greater than the charge peak power or to drop the maximum power to the charge rated power according to the charge reference power and the charge comparison power comprises:

determining whether the charge comparison power is less than N1 times of the charge reference power;

if the charge comparison power is not less than N1 times of the charge reference power, controlling an absolute value of the maximum power fed back to the battery to be not greater than an absolute value of the charge peak power;

if the charge comparison power is less than N1 times of the charge reference power, further determining whether the charge comparison power is less than N2 times of the charge reference power;

if the charge comparison power is less than N2 times of the charge reference power, controlling the absolute value of the maximum power fed back to the battery to be not greater than an absolute value of the charge rated power after controlling an absolute value of a power fed back to the battery to drop the absolute value of the power to the absolute value of the charge rated power; and if the charge comparison power is not less than N2 times of the charge reference power, controlling the absolute value of the maximum power fed back to the battery to be not greater than the absolute value of the charge peak power, wherein N1 and N2 are positive numbers and N1 is smaller than N2.

9. The method as claimed in claim 8, wherein:

after determining that the discharge comparison power is not greater than N1 times of the discharge reference power and before controlling the maximum power output by the battery to be not greater than the discharge peak power, the method further comprises maintaining a value of a first flag representing a discharge degree at a first initial value, and after determining that the discharge comparison power is greater than N2 times of the discharge reference power and before controlling the power output by the battery to drop the power to the discharge rated power, the method further comprises setting the value of the first flag as a first predetermined value, or after determining that the charge comparison power is not less than N1 times of the charge reference power and before controlling the absolute value of the maximum power fed back to the battery to be not greater than the absolute value of the charge peak power, the method further comprises maintaining a value of a second flag representing a charge degree at a second initial value, and after determining that the charge comparison power is less than N2 times of the charge reference power and before controlling the absolute value of the power fed back to the battery to drop the absolute value of the power to the absolute value of the charge rated power, the method further comprises setting the value of the second flag as a second predetermined value.

10. The method as claimed in claim 9, wherein:
after determining that the discharge comparison power is greater than N1 times of the discharge reference power, the method further comprises: determining whether the value of the first flag is the first initial value; if the value of the first flag is the first initial value, determining whether the discharge comparison power is greater than N2 times of the discharge reference power; and if the value of the first flag is not the first initial value, controlling the maximum power output by the battery to be not greater than the discharge rated power after controlling the power output by the battery to drop the power to the discharge rated power; or
after determining that the charge comparison power is less than N1 times of the charge reference power, the method further comprises: determining whether the value of the second flag is the second initial value; if the value of the second flag is the second initial value, determining whether the charge comparison power is less than N2 times of the charge reference power; and if the value of the second flag is not the second initial value, controlling the absolute value of the maximum power fed back to the battery to be not greater than the absolute value of the charge rated power after controlling the absolute value of the power fed back to the battery to drop the absolute value of the power to the absolute value of the charge rated power.

11. The method as claimed in claim 6, wherein when the prescribed power parameters comprise a discharge peak power or a charge peak power, the prescribed power parameters further comprise a discharge rated power or a charge rated power, the comparison power comprises a discharge comparison power and/or a charge comparison power, determining a difference between the peak powers and the rated power according to the rated power and the peak powers comprises:
calculating the discharge reference power according to a difference between the discharge peak power and the discharge rated power or calculating the charge reference power according to a difference between the charge peak power and the charge rated power, and
determining a difference between the current actual power and the prescribed power parameters according to the prescribed power parameters and the current actual power comprises:
performing an integral process on a difference between the current actual power and the discharge rated power to obtain the discharge comparison power or performing an integral process on a difference between the current actual power and the charge rated power to obtain the charge comparison power.

12. The method as claimed in claim 6, wherein when the prescribed power parameters comprise a discharge peak power or a charge peak power, the reference power comprises a discharge reference power and/or a charge reference power, determining a difference between the peak powers and the rated powers according to the rated powers and the peak powers comprises:
performing an integral process on the discharge peak power to calculate the discharge reference power or performing an integral process on the charge peak power to calculate the charge reference power, and
determining the comparison power according to the prescribed power parameters and the current actual power comprises:
performing an integral process on the current actual power to obtain the discharge comparison power or performing an integral process on the actual power to obtain the charge comparison power.

13. An electric vehicle, comprising a battery and a controller, wherein the controller controls a power of the battery according to the method as claimed in claim 6.

14. An electric vehicle, comprising a battery and a controller, wherein the controller controls a power of the battery according to the method as claimed in claim 1.

* * * * *